(12) United States Patent
Cheng et al.

(10) Patent No.: US 12,506,065 B2
(45) Date of Patent: Dec. 23, 2025

(54) SEMICONDUCTOR STRUCTURE AND METHOD FOR MANUFACTURING THE SAME

(71) Applicant: MACRONIX INTERNATIONAL CO., LTD., Hsinchu (TW)

(72) Inventors: Chih-Chieh Cheng, Zhubei (TW); Wen-Jer Tsai, Hualien (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 635 days.

(21) Appl. No.: 17/818,454

(22) Filed: Aug. 9, 2022

(65) Prior Publication Data
US 2024/0055347 A1    Feb. 15, 2024

(51) Int. Cl.
| | |
|---|---|
| *H01L 23/522* | (2006.01) |
| *H01L 21/762* | (2006.01) |
| *H01L 21/768* | (2006.01) |
| *H01L 23/00* | (2006.01) |

(52) U.S. Cl.
CPC .... *H01L 23/5226* (2013.01); *H01L 21/76251* (2013.01); *H01L 21/76898* (2013.01); *H01L 24/08* (2013.01); *H01L 2224/08145* (2013.01)

(58) Field of Classification Search
None
See application file for complete search history.

(56) References Cited

U.S. PATENT DOCUMENTS

| | | | |
|---|---|---|---|
| 11,424,208 B2 | 8/2022 | Liu | |
| 2014/0346622 A1* | 11/2014 | Stuber | H01L 21/2007 438/51 |
| 2017/0218128 A1* | 8/2017 | Kawai | C08K 5/3435 |

FOREIGN PATENT DOCUMENTS

| | | | | |
|---|---|---|---|---|
| CN | 110546762 | * | 12/2019 | ........... G11C 11/005 |
| TW | 1759678 B | | 4/2022 | |

OTHER PUBLICATIONS

Machnine translation of CN110546762 (A) (Year: 2019).*

* cited by examiner

*Primary Examiner* — Bilkis Jahan
(74) *Attorney, Agent, or Firm* — McClure, Qualey & Rodack, LLP

(57) ABSTRACT

A semiconductor structure is provided. The semiconductor structure includes a first substrate, a device layer, a first dielectric layer, a second dielectric layer, a second substrate, and a circuit layer. The device layer is disposed on the first substrate. The first dielectric layer is disposed on the device layer. The second dielectric layer is disposed on the first dielectric layer. The second substrate is disposed on the second dielectric layer. The circuit layer is disposed on the second substrate.

8 Claims, 7 Drawing Sheets

SEMICONDUCTOR STRUCTURE AND METHOD FOR MANUFACTURING THE SAME

TECHNICAL FIELD

This disclosure relates to a semiconductor structure and a method for manufacturing the same. More particularly, this disclosure relates to a semiconductor structure comprising a device layer and a circuit layer and a method for manufacturing the same.

BACKGROUND

In order to increase the footprint of memory arrays in semiconductor devices, a structure in which the memory array structure are provided on the whole circuit layer has been developed to replace the conventional structure in which the circuit area are disposed near the memory array area. In a manufacturing solution, the circuit layer may be firstly formed on the whole active area of a substrate, and then the array memory array structure may be directly formed on the whole circuit layer. However, since the circuit layer is formed at first, it will suffer thermal budget produced by the manufacturing process of the memory array structure, and thus the characteristics thereof may be disadvantageously affected. In another manufacturing solution, the circuit layer and the memory array structure may be independently formed on two substrates, and then the memory array structure may be bonded to the circuit layer, and the additional substrate used for carrying the memory array structure can be removed. However, the bonding process is a hybrid bonding process in which metal and dielectric materials are bonding simultaneously. Such a process is difficult because of the hybrid materials bonding, fine element pitches, and precise alignment requirement, etc.

SUMMARY

In this disclosure, a semiconductor structure with a large memory array footprint formed by a simpler manufacturing method and such a method are provided.

A semiconductor structure according to embodiments comprises a first substrate, a device layer, a first dielectric layer, a second dielectric layer, a second substrate, and a circuit layer. The device layer is disposed on the first substrate. The first dielectric layer is disposed on the device layer. The second dielectric layer is disposed on the first dielectric layer. The second substrate is disposed on the second dielectric layer. The circuit layer is disposed on the second substrate.

A method for manufacturing a semiconductor structure according to embodiments comprises following steps. A first structure comprising a first substrate, a device layer, and a first dielectric layer is provided, wherein the device layer is formed on the first substrate, and the first dielectric layer is formed on the device layer. A second structure comprising a second substrate and a second dielectric layer is provided, wherein the second dielectric layer is formed on the second substrate. Then, the second structure is bonded to the first structure, wherein the second dielectric layer is bonded with the first dielectric layer. Thereafter, the second substrate is split. A circuit layer is formed on a remaining portion of the second substrate.

Figure 1:
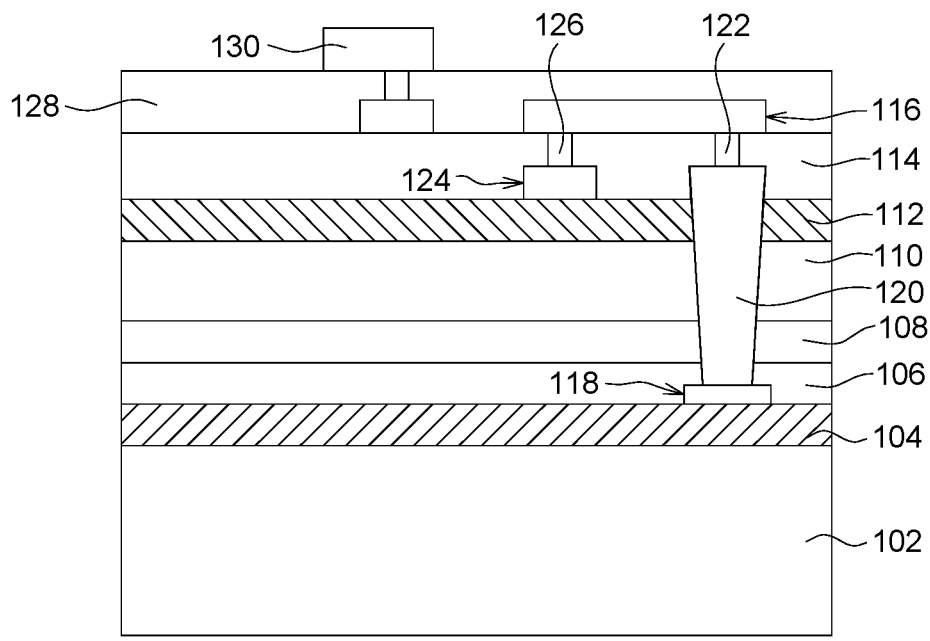
FIG. 1 illustrates an exemplary semiconductor structure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The description and the drawings are provided for illustrative only, and not intended to result in a limitation. For clarity, the elements may not be drawn to scale. In addition, some elements and/or reference numerals may be omitted from some drawings. It is contemplated that the elements and features of one embodiment can be beneficially incorporated in another embodiment without further recitation.

Referring to FIG. 1, an exemplary semiconductor structure 100 of the disclosure is shown. The semiconductor structure 100 comprises a first substrate 102, a device layer 104, a first dielectric layer 106, a second dielectric layer 108, a second substrate 110, and a circuit layer 112. The device layer 104 is disposed on the first substrate 102. The first dielectric layer 106 is disposed on the device layer 104. The second dielectric layer 108 is disposed on the first dielectric layer 106. The second substrate 110 is disposed on the second dielectric layer 108. The circuit layer 112 is disposed on the second substrate 110.

Specifically, the first substrate 102 and the second substrate 110 may be individually comprise Si, SiGe, III-V semiconductor, or the like, but the disclosure is not limited thereto. The III-V semiconductor may be GaAs, GaN, or the like.

The device layer 104 may comprise a memory array structure. For example, the memory array structure may comprise a 3D NAND array, a 2D NAND array, a NOR array, a DRAM array, or the like. However, the disclosure is not limited thereto. For some additional or alternative application, the device layer 104 may comprise semiconductor devices other than the memory array structure. In some embodiments, the device layer 104 may comprise an image sensor. In some embodiments, the device layer 104 may comprise an application specific integrated circuit (ASIC), a processor, and/or the like.

The circuit layer 112 is configured for controlling the device layer 104. For example, the circuit layer 112 may comprise an application specific integrated circuit (ASIC), a processor, and/or the like, but the disclosure is not limited thereto. More specifically, in some embodiments, the circuit layer 112 may comprise electronic components (not shown) for controlling the device layer 104, such as CMOS or the like.

According to some embodiments, the semiconductor structure 100 may further comprise a top dielectric layer 114 and a wiring layer 116. The top dielectric layer 114 is disposed on the circuit layer 112. The wiring layer 116 is disposed on the top dielectric layer 114. The wiring layer 116 is coupled to the device layer 104 and the circuit layer 112.

More specifically, the semiconductor structure 100 may further comprise a first conductive layer 118, a via 120, a first conductor 122, a second conductive layer 124, and a second conductor 126. The first conductive layer 118 is disposed on the device layer 104. The via 120 is through the top dielectric layer 114, the circuit layer 112, the second substrate 110, the second dielectric layer 108, and the first dielectric layer 106. The via 120 lands on the first conductive layer 118. The first conductor 122 is through the top dielectric layer 114. The first conductor 122 connects the wiring layer 116 and the via 120. The second conductive layer 124 is disposed on the circuit layer 112. The second conductor 126 is through the top dielectric layer 114. The second conductor 126 connects the wiring layer 116 and the second conductive layer 124. As such, the wiring layer 116 can be coupled to the device layer 104 through the first conductor 122, the via 120, and the first conductive layer 118, and the wiring layer 116 can be coupled to the circuit layer 112 through the second conductor 126 and the second conductive layer 124.

According to some embodiments, the semiconductor structure 100 may further comprise another top dielectric layer 128 and a bonding pad 130. The top dielectric layer 128 is disposed on the wiring layer 116. The bonding pad 130 is disposed on the top dielectric layer 128. The bonding pad 130 is coupled to the wiring layer 116.

Figure 2:
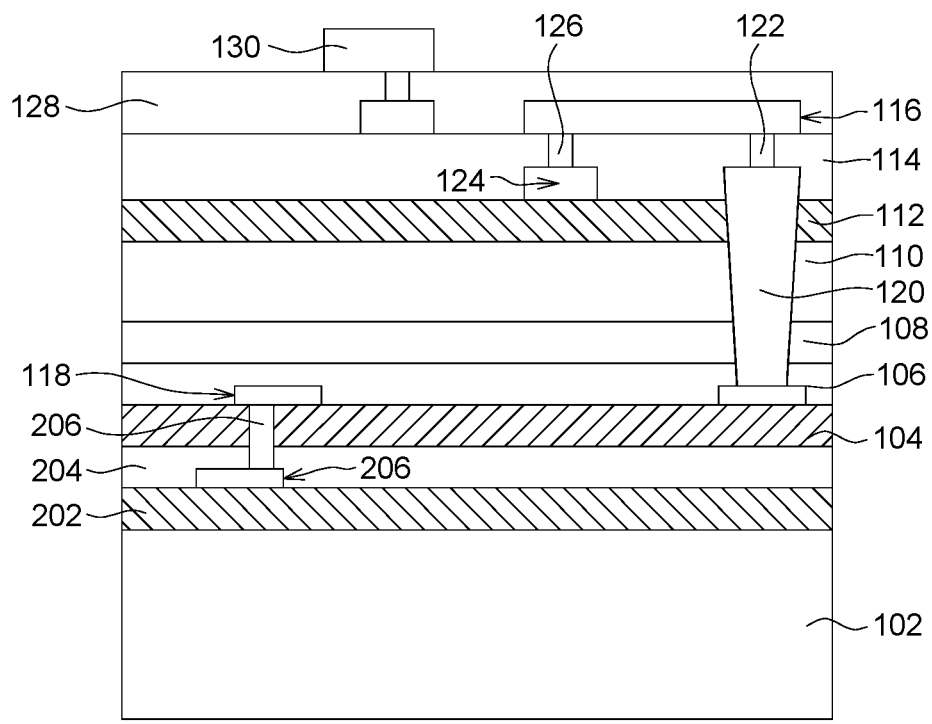
FIG. 2 illustrates another exemplary semiconductor structure.

Referring to FIG. 2, another exemplary semiconductor structure 200 of the disclosure is shown. The semiconductor structure 200 further comprises a bottom circuit layer 202 and a bottom dielectric layer 204. The bottom circuit layer 202 is disposed on the first substrate 102. The bottom circuit layer 202 may comprise electronic components (not shown) that are less easy to be deteriorated by the process for manufacturing the device layer 104. In some embodiments, the bottom circuit layer 202 may comprise an ASIC, a processor, and/or the like, but the disclosure is not limited thereto. The bottom dielectric layer 204 is disposed on the bottom circuit layer 202. The device layer 104 is disposed on the bottom dielectric layer 204. The semiconductor structure 200 may further comprise a bottom conductive layer 206 and a via 208. The bottom conductive layer 206 is disposed on the bottom circuit layer 202. The via 208 is through the device layer 104 and the bottom dielectric layer 204. The via 208 lands on the bottom conductive layer 206. As such, the first conductive layer 118 can be coupled to the bottom circuit layer 202 through the via 208 and the bottom conductive layer 206. Other details are similar to those of the semiconductor structure 100, and are omitted herein.

Referring to FIGS. 3A-3F, an exemplary method of the disclosure for manufacturing a semiconductor structure is shown.

Figure 3A:
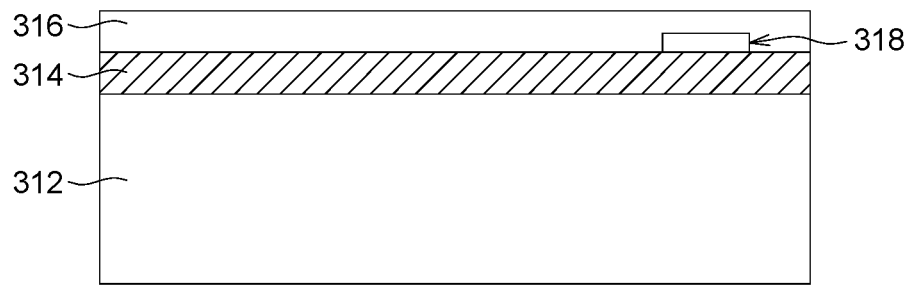
FIGS. 3A-3F illustrate various stages of an exemplary method for manufacturing a semiconductor structure.

As shown in FIG. 3A, a first structure 310 comprising a first substrate 312, a device layer 314, and a first dielectric layer 316 is provided. The device layer 314 is formed on the first substrate 312. The first dielectric layer 316 is formed on the device layer 314. Specifically, the first substrate 312 may comprises Si, SiGe, III-V semiconductor, or the like, but the disclosure is not limited thereto. The III-V semiconductor may be GaAs, GaN, or the like. The device layer 314 may comprise a memory array structure, which may comprise a 3D NAND array, a 2D NAND array, a NOR array, a DRAM array, or the like. However, the disclosure is not limited thereto. For some additional or alternative application, the device layer 314 may comprise an image sensor, and/or the device layer 314 may comprise an application specific integrated circuit (ASIC), a processor, and/or the like. The first dielectric layer 316 may be formed of oxide and used as a passivation layer. According to some embodiments, the first structure 310 may further comprise a first conductive layer 318 on the device layer 314. The first conductive layer 318 may comprise metal, but the disclosure is not limited thereto.

Figure 3B:
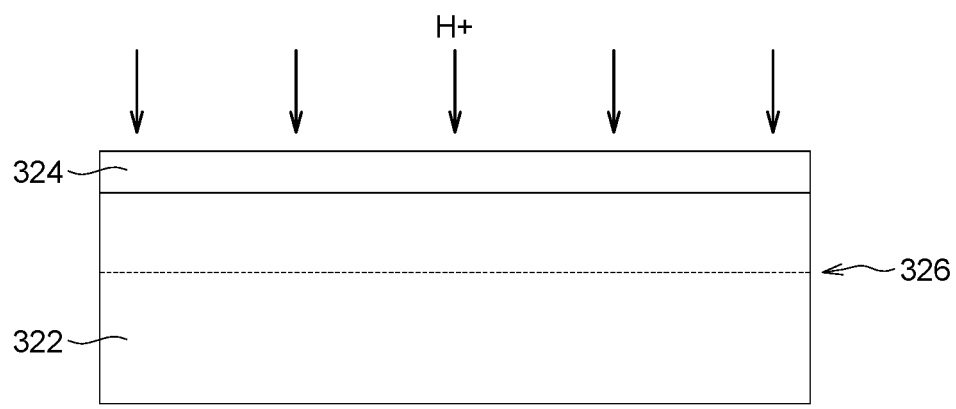

As shown in FIG. 3B, a second structure 320 comprising a second substrate 322 and a second dielectric layer 324 is provided. The second dielectric layer 324 is formed on the second substrate 322. Specifically, the second substrate 322 may comprise Si, SiGe, III-V semiconductor, or the like, but the disclosure is not limited thereto. The III-V semiconductor may be GaAs, GaN, or the like. The second dielectric layer 324 may be formed of oxide and used as a passivation layer. According to some embodiments, this step may further comprise implanting H$^+$ ions to form an implant interface 326 in the second substrate 322, as indicated by arrows. As such, in a subsequent process, the second substrate 322 can be split along the implant interface 326. In some embodiments, a depth of the implant interface 326 in the second substrate 322 may be 0.5 μm to 10 μm. After the implanting process, a cleaning process may be optionally conducted.

Figure 3C:
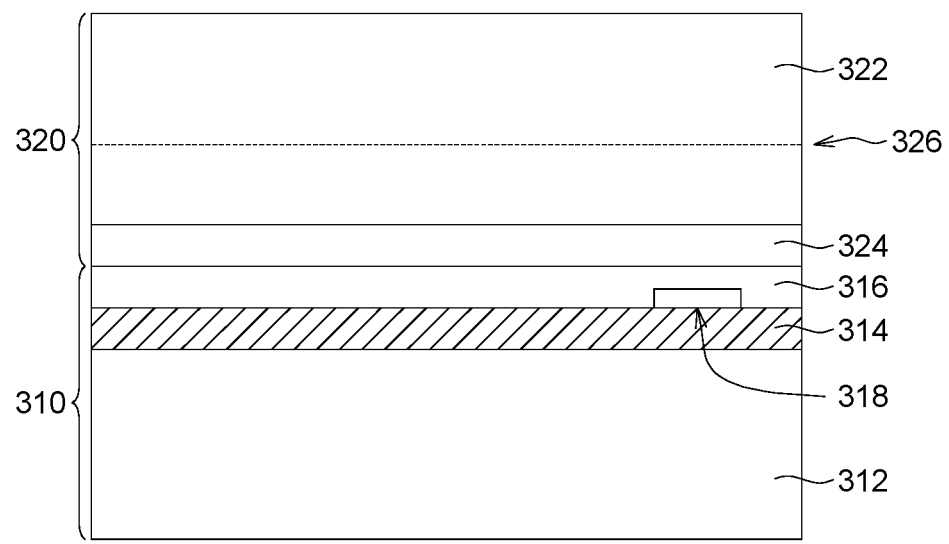

As shown in FIG. 3C, the second structure 320 is bonded to the first structure 310, wherein the second dielectric layer 324 is bonded with the first dielectric layer 316. In this step, the first dielectric layer 316 formed of oxide and the second dielectric layer 324 formed of oxide are used as bonding layers. Since the second substrate 322 of the second structure 320 is still a bare substrate without any electronic components or elements thereof, the bonding can be conducted easily without accurate alignment.

Figure 3D:
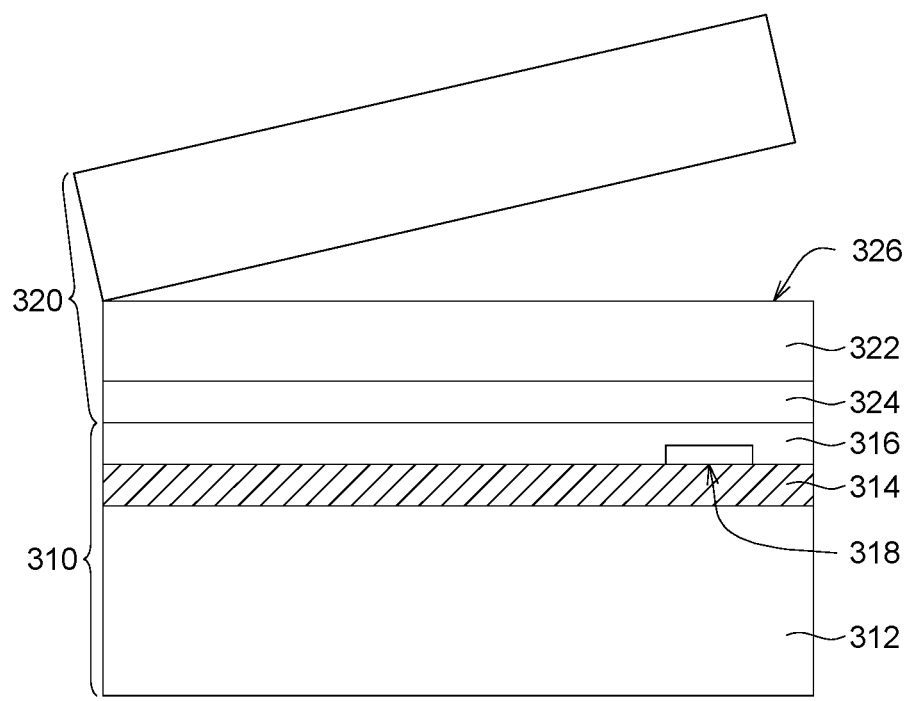

As shown in FIG. 3D, the second substrate 322 is split. The second substrate 322 may be split along the implant interface 326. Then, an annealing process, a polishing process, and the like may be optionally conducted.

Figure 3E:
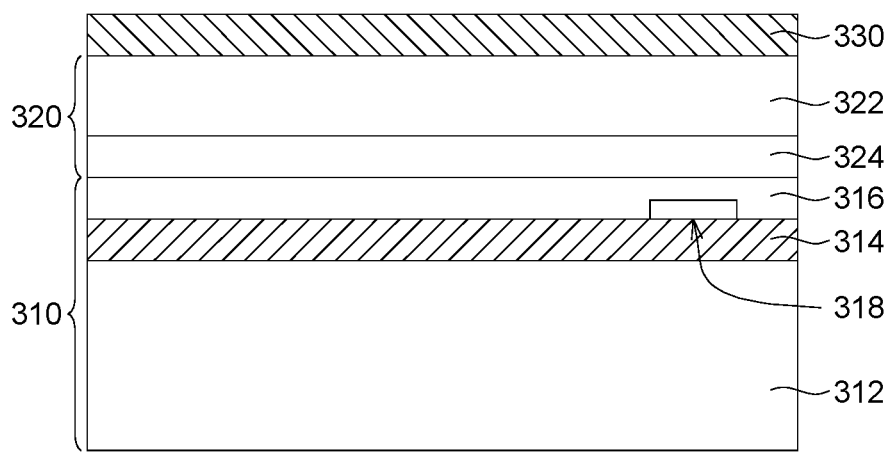

As shown in FIG. 3E, a circuit layer 330 is formed on a remaining portion of the second substrate 322. The remaining portion of the second substrate 322 may be used as an active layer for the manufacturing of the circuit layer 330. The circuit layer 330 may be used for controlling the device layer 314. For example, the circuit layer 330 may comprise an ASIC, a processor, and/or the like, but the disclosure is not limited thereto. More specifically, in some embodiments, the circuit layer 330 may comprise electronic components (not shown) for controlling the device layer 314, such as CMOS or the like. Since the circuit layer 330 is formed after the device layer 314, it will not suffer thermal budget produced by the manufacturing process of the device layer 314. In addition, the circuit layer 330 can be optimized independently. At the same time, the device layer 314 is more robust than the circuit layer 330, and it will not be deteriorated by the process for manufacturing the circuit layer 330.

Figure 3F:
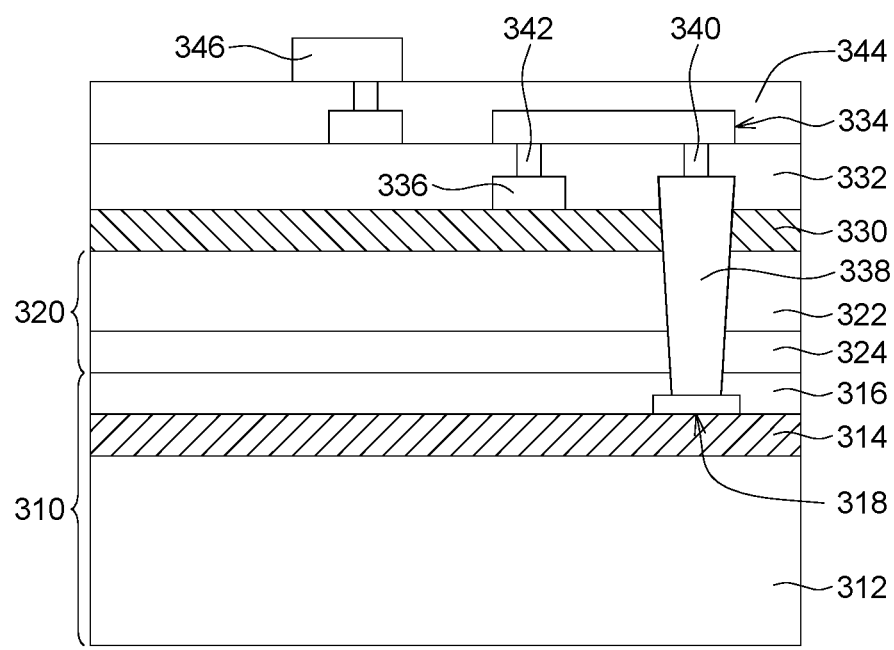

As shown in FIG. 3F, the method of the disclosure may further comprise BEOL processes. For example, a top dielectric layer 332 may be formed on the circuit layer 330. A wiring layer 334 may be formed on the top dielectric layer 332. The wiring layer 334 is coupled to the device layer 314 and the circuit layer 330. In some embodiments, a second conductive layer 336 may be formed on the circuit layer 330. A via 338 may be formed through the top dielectric layer 332, the circuit layer 330, the second substrate 322, the second dielectric layer 324, and the first dielectric layer 316. The via 338 lands on the first conductive layer 318. A first conductor 340 and a second conductor 342 may be formed through the top dielectric layer 332 and connect to the via 338 and the second conductive layer 336, respectively. As such, the wiring layer 334 can be coupled to the device layer 314 through the first conductor 340, the via 338, and the first conductive layer 318, and the wiring layer 334 can be coupled to the circuit layer 330 through the second conductor 342 and the second conductive layer 336. According to some embodiments, another top dielectric layer 344 may be formed on the wiring layer 334, and a bonding pad 346 may be formed on the top dielectric layer 344. The bonding pad 346 is coupled to the wiring layer 334.

In this disclosure, the second substrate of the second structure is still a bare substrate during the bonding process. The bonding can be conducted easily because accurate alignment is unneeded. As such, a semiconductor structure with a large memory array footprint can be manufactured by a simpler method. In addition, since the circuit layer is formed after the device layer, the circuit layer will not be affected by thermal budget produced in the manufacturing process of the device layer, and the electronic components thereof will not be deteriorated accordingly.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
    a first substrate;
    a device layer disposed on the first substrate;
    a first dielectric layer disposed on the device layer;
    a second dielectric layer disposed on the first dielectric layer;
    a second substrate disposed on the second dielectric layer, wherein the second substrate comprises Si, SiGe, or III-V semiconductor; and
    a circuit layer disposed on the second substrate.

2. The semiconductor structure according to claim 1, wherein the first substrate comprises Si, SiGe, or III-V semiconductor.

3. The semiconductor structure according to claim 1, wherein the device layer comprises a memory array structure.

4. The semiconductor structure according to claim 3, wherein the memory array structure comprises a 3D NAND array, a 2D NAND array, a NOR array, or a DRAM array.

5. The semiconductor structure according to claim 1, wherein the device layer comprises an image sensor, or wherein the device layer comprises an application specific integrated circuit (ASIC) or a processor.

6. The semiconductor structure according to claim 1, wherein the circuit layer is configured for controlling the device layer.

7. The semiconductor structure according to claim 1, further comprising:
    a top dielectric layer disposed on the circuit layer;
    a wiring layer disposed on the top dielectric layer, the wiring layer coupled to the device layer and the circuit layer;
    a first conductive layer disposed on the device layer;
    a via through the top dielectric layer, the circuit layer, the second substrate, the second dielectric layer, and the first dielectric layer, the via landing on the first conductive layer;
    a first conductor through the top dielectric layer, the first conductor connecting the wiring layer and the via;
    a second conductive layer disposed on the circuit layer;
    a second conductor through the top dielectric layer, the second conductor connecting the wiring layer and the second conductive layer;
    another top dielectric layer disposed on the wiring layer; and
    a bonding pad disposed on the another top dielectric layer, the bonding pad coupled to the wiring layer;
    wherein the wiring layer is coupled to the device layer through the first conductor, the via, and the first conductive layer, and wherein the wiring layer is coupled to the circuit layer through the second conductor and the second conductive layer.

8. The semiconductor structure according to claim 1, further comprising:
    a bottom circuit layer disposed on the first substrate; and
    a bottom dielectric layer disposed on the bottom circuit layer;
    wherein the device layer is disposed on the bottom dielectric layer.

* * * * *